US012640539B2

(12) United States Patent
Ooi et al.

(10) Patent No.: US 12,640,539 B2
(45) Date of Patent: May 26, 2026

(54) TUNABLE WAVELENGTH GAIN CHIP ARRAY FOR SENSING AND COMMUNICATION

(71) Applicant: KING ABDULLAH UNIVERSITY OF SCIENCE AND TECHNOLOGY, Thuwal (SA)

(72) Inventors: Boon S. Ooi, Thuwal (SA); Omar Alkhazragi, Thuwal (SA); Tien Khee Ng, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 755 days.

(21) Appl. No.: 18/008,289

(22) PCT Filed: Jun. 15, 2021

(86) PCT No.: PCT/IB2021/055269
§ 371 (c)(1),
(2) Date: Dec. 5, 2022

(87) PCT Pub. No.: WO2021/255641
PCT Pub. Date: Dec. 23, 2021

(65) Prior Publication Data
US 2023/0198218 A1 Jun. 22, 2023

Related U.S. Application Data

(60) Provisional application No. 63/039,673, filed on Jun. 16, 2020.

(51) Int. Cl.
*H01S 5/00* (2006.01)
*H01S 5/02251* (2021.01)
(Continued)

(52) U.S. Cl.
CPC .......... *H01S 5/146* (2013.01); *H01S 5/02251* (2021.01); *H01S 5/02461* (2013.01);
(Continued)

(58) Field of Classification Search
CPC .. H01S 5/146; H01S 5/02251; H01S 5/02461; H01S 5/1221; H01S 5/125;
(Continued)

(56) References Cited

U.S. PATENT DOCUMENTS 5,324,964 A * 6/1994 Ackley .............. H10H 20/8142
372/45.01
9,768,587 B1 * 9/2017 Zheng .................... H01S 5/1092
(Continued)

FOREIGN PATENT DOCUMENTS

JP H11112085 A 4/1999

OTHER PUBLICATIONS

International Search Report in corresponding/related International Application No. PCT/IB2021/055269, date of mailing Sep. 28, 2021.
(Continued)

*Primary Examiner* — Kinam Park
(74) *Attorney, Agent, or Firm* — PATENT PORTFOLIO BUILDERS PLLC

(57) ABSTRACT

An array of surface-emitting gain chips includes a common substrate, plural gain chips formed on the common substrate, each configured to generate a light beam, plural optical couplers, each located on a top surface of a corresponding gain chip of the plural gain chips, plural optical fibers, each connected with one end to a corresponding optical coupler of the plurality of optical couplers, an array wide optical coupler connected to another end of the plural optical fibers, and a single optical fiber connected to the array wide optical coupler and configured to output the combined light beams.

20 Claims, 9 Drawing Sheets

(51) Int. Cl.

| | |
|---|---|
| *H01S 5/024* | (2006.01) |
| *H01S 5/12* | (2021.01) |
| *H01S 5/125* | (2006.01) |
| *H01S 5/14* | (2006.01) |
| *H01S 5/183* | (2006.01) |
| *H01S 5/187* | (2006.01) |
| *H01S 5/22* | (2006.01) |
| *H01S 5/40* | (2006.01) |
| *H01S 5/42* | (2006.01) |
| *H10H 20/00* | (2025.01) |
| *H01S 5/042* | (2006.01) |
| *H10H 29/14* | (2025.01) |

(52) U.S. Cl.
CPC ............ *H01S 5/1221* (2013.01); *H01S 5/125* (2013.01); *H01S 5/18394* (2013.01); *H01S 5/187* (2013.01); *H01S 5/2214* (2013.01); *H01S 5/2223* (2013.01); *H01S 5/4012* (2013.01); *H01S 5/423* (2013.01); *H10H 20/042* (2025.01); *H01S 5/04257* (2019.08); *H01S 5/141* (2013.01); *H01S 5/4087* (2013.01); *H10H 29/14* (2025.01)

(58) Field of Classification Search
CPC .... H01S 5/18394; H01S 5/187; H01S 5/2214; H01S 5/2223; H01S 5/4012; H01S 5/423; H01S 5/04257; H01S 5/141; H01S 5/4087; H10H 20/042; H10H 29/14
See application file for complete search history.

(56) References Cited

U.S. PATENT DOCUMENTS

| | | | | |
|---|---|---|---|---|
| 2005/0078726 | A1* | 4/2005 | Watanabe | B82Y 20/00 |
| | | | | 372/46.01 |
| 2006/0056476 | A1* | 3/2006 | Hiiro | H01S 5/18388 |
| | | | | 372/50.124 |
| 2014/0247841 | A1* | 9/2014 | Seurin | H01S 3/10 |
| | | | | 359/341.1 |
| 2017/0227839 | A1* | 8/2017 | Maaskant | H01S 5/026 |
| 2020/0333438 | A1* | 10/2020 | Petrov | H01S 5/0428 |
| 2023/0047142 | A1* | 2/2023 | Ooi | H04B 10/116 |

OTHER PUBLICATIONS

Schnitzer, P., et al., "Linear 1×8 GaAs VCSEL Arrays for 24 Gbit/s Data Rate Transmission," Electronics Letters, Aug. 26, 1997 vol. 34, No. 2, pp. 187-189, IEEE.
Written Opinion of the International Searching Authority in corresponding/related International Application No. PCT/IB2021/055269, date of mailing Sep. 28, 2021.

* cited by examiner

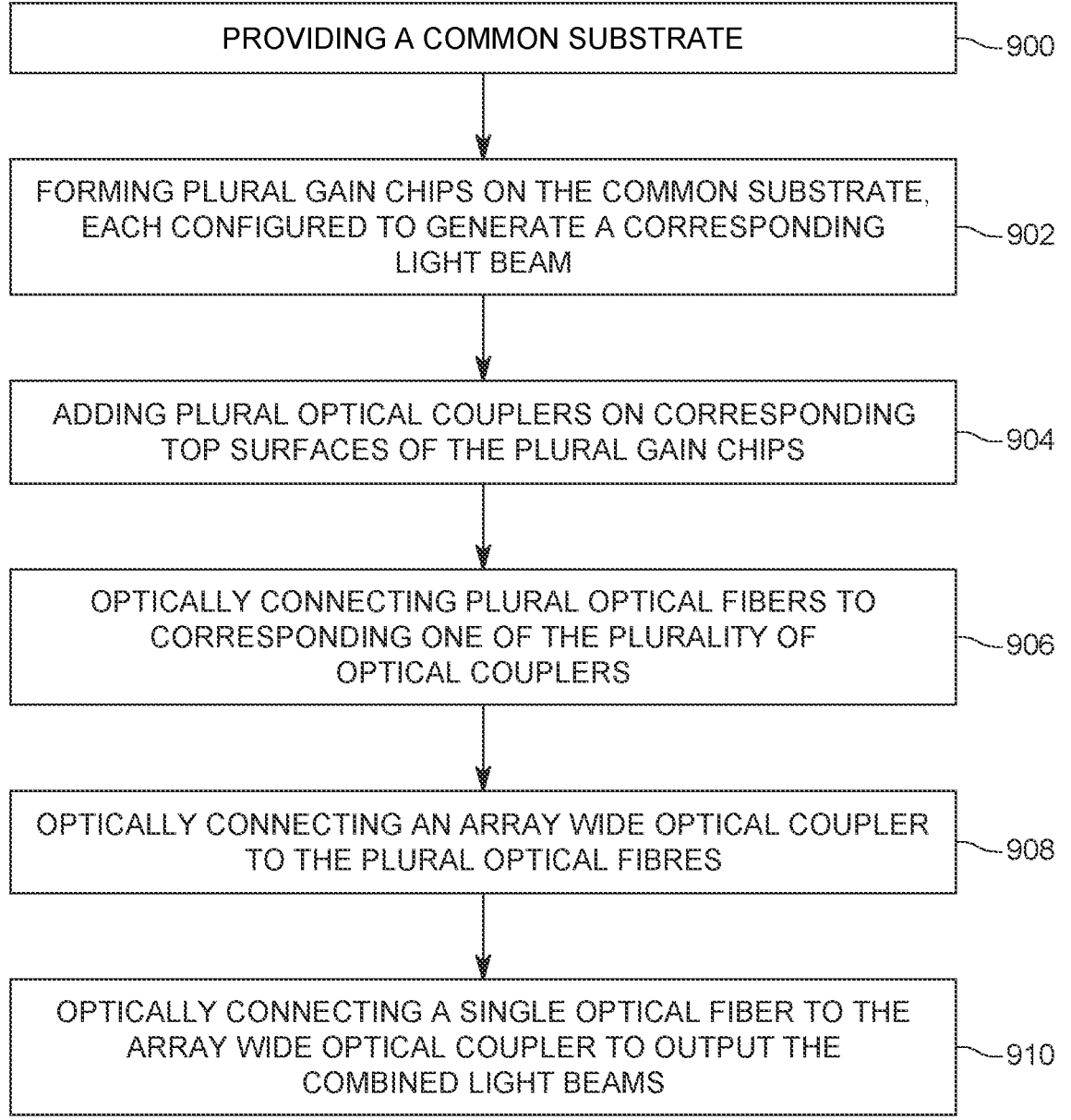

PROVIDING A COMMON SUBSTRATE — 900

FORMING PLURAL GAIN CHIPS ON THE COMMON SUBSTRATE, EACH CONFIGURED TO GENERATE A CORRESPONDING LIGHT BEAM — 902

ADDING PLURAL OPTICAL COUPLERS ON CORRESPONDING TOP SURFACES OF THE PLURAL GAIN CHIPS — 904

OPTICALLY CONNECTING PLURAL OPTICAL FIBERS TO CORRESPONDING ONE OF THE PLURALITY OF OPTICAL COUPLERS — 906

OPTICALLY CONNECTING AN ARRAY WIDE OPTICAL COUPLER TO THE PLURAL OPTICAL FIBRES — 908

OPTICALLY CONNECTING A SINGLE OPTICAL FIBER TO THE ARRAY WIDE OPTICAL COUPLER TO OUTPUT THE COMBINED LIGHT BEAMS — 910

FIG. 9

TUNABLE WAVELENGTH GAIN CHIP ARRAY FOR SENSING AND COMMUNICATION

CROSS-REFERENCE TO RELATED APPLICATIONS

This application is a U.S. National Stage Application of International Application No. PCT/IB2021/055269, filed on Jun. 15, 2021, which claims priority to U.S. Provisional Patent Application No. 63/039,673, filed on Jun. 16, 2020, entitled "TUNABLE WAVELENGTH SURFACE-EMITTING SUPERLUMINESCENT DIODE ARRAY FOR SENSING AND COMMUNICATION," the disclosures of which are incorporated herein by reference in their entirety.

BACKGROUND

Technical Field

Embodiments of the subject matter disclosed herein generally relate to an array of surface-emitting superluminescent diodes (SLDs) that can be integrated with available technologies in the fields of optical sensing and communication, and more particularly, to SLDs having a broad emission spectrum with high efficiency and directionality.

Discussion of the Background

Semiconductor light sources have been used in a variety of applications, from solid-state lighting, to telecommunication, to detection and ranging. They offer high brightness, high speeds, and reliable performance in a compact structure. These light sources come in a variety of forms, one of which, is the light-emitting diode (LED), which generates the light through spontaneous emission. The spontaneous emission is defined herein as the generation of a photon from an electron transitioning to a lower energy state. When a current is injected into the LEDs, the current excites more electrons to higher energy levels. Light is then generated as these electrons transition back to lower energies, providing a stream of photons from the LED. These photons are incoherent, which means that the electromagnetic wave of each photon has a random phase and thus, the phases of the generated photons are not coordinated, as in the case of a laser device.

Another form of a semiconductor light source is the laser diode (LD), which relies on stimulated emission for producing the coherent photons. The photons emitted from the active region of the LD stimulate excited electrons to transition to lower energies, generating more photons with the same frequency and phase. However, the high coherency of the light from the LDs introduces random interferences, which makes them unsuitable for several applications such as imaging and illumination.

Another light source that lies between the LEDs and LDs in terms of their characteristics is the SLD. The SLDs combine the (1) high efficiency and directionality of the LDs, which operate in stimulated emission, with (2) a broader emission spectrum, which is normally associated with LEDs operating in spontaneous emission. While stimulated emission plays an important role in SLDs, the lasing action in these devices is suppressed, lowering the intensity and the coherence of the emitted light. Since SLDs have a shorter coherence length compared to LDs, they do not suffer from the random interference exhibited by the light of the LDs. The principle on which SLDs are based is amplified spontaneous emission (ASE), in which a gain medium is used to amplify the light generated from spontaneous emission. A typical gain medium in the semiconductor SLDs is designed based on multiple quantum wells (MQWs), whose bandgap defines the wavelength of the emitted and amplified photons.

Though most available SLDs emit light laterally (i.e., through a lateral side of a mesa), there are important advantages to extracting the output optical power from the top surface of the mesa instead. This allows for easy on-wafer testing and the formation of large arrays. It also makes mounting the fibers directly to each device in the array simpler. However, given the small thickness of the active region in semiconductor light sources, achieving the amplification of light requires more than a single pass through the gain medium. This can be done by reflecting the light through it multiple times using mirrors that form a resonating cavity. This design is implemented in resonant-cavity LEDs (RC-LEDs) and vertical cavity surface-emitting lasers (VCSELs)

In RC-LEDs, the active region is sandwiched between two distributed Bragg reflectors (DBRs). This type of reflectors consists of several pairs of two alternating layers whose optical thickness is a quarter of the wavelength supported by the gain medium. From the several reflections from these layers, most of the light can be directed back from the bottom mirror. The top mirror of RC-LEDs has a lower reflectivity to allow for the light to be extracted.

In VCSELs, the top DBR is designed to have very high reflectivity, which reduces the extracted spontaneous emission light, but allows for lasing. Careful design of the cavity is required to improve the confinement factor of the device, $\Gamma$, which increases its efficiency. By placing the active region at the antinode of the electromagnetic field, the number of photons contributing to stimulated emission is increased. Another important feature of the VCSELs is the inclusion of an oxide aperture, which confines the current, lowering the lasing threshold. It also confines the optical mode to the center of the device since the oxidation process changes the refractive index of the lateral side of the VCSEL, which changes its optical thickness, making the structure of the device act as a waveguide.

Although the RC-LEDs and VCSELs have found numerous applications in telecommunication and ranging, their characteristics are not ideal for many applications. The RC-LEDs, while more efficient than regular surface-emitting LEDs, are not as efficient as the lasers are. They also support narrower modulation bandwidths as compared to the lasers, and they emit incoherent light. VCSELs, on the other hand, are less reliable and are more temperature sensitive. They also have long coherence length, which gives rise to random interferences.

Therefore, it is apparent that there is a need for surface-emitting SLDs that combine the reliability of LEDs with the high brightness and fast response of lasers without resorting to lasing. These SLDs would be practical in applications where RC-LEDs and VCSELs are used in addition to other applications that take advantage of the unique characteristics of ASE.

BRIEF SUMMARY OF THE INVENTION

According to an embodiment, there is an array of surface-emitting gain chips that includes a common substrate, plural gain chips formed on the common substrate, each configured to generate a light beam, plural optical couplers, each located on a top surface of a corresponding gain chip of the plural gain chips, plural optical fibers, each connected with one end to a corresponding optical coupler of the plurality of optical couplers, an array wide optical coupler connected to another end of the plural optical fibers, and a single optical fiber connected to the array wide optical coupler and configured to output the combined light beams.

According to another embodiment, there is an array of surface-emitting gain chips that includes a common substrate, plural gain chips formed on the common substrate, each configured to generate a light beam, plural optical couplers, each located on a top surface of a corresponding gain chip of the plural gain chips, plural optical fibers, each connected with one end to a corresponding optical coupler of the plurality of optical couplers, a feedback control mechanism connected to the plural optical fibers and configured to switch between a first optical path that has a wavelength tunning element and a second optical path that does not have a wavelength tunning element, and a single optical fiber connected to the feedback control mechanism and configured to output the combined light beams.

According to still another embodiment, there is a method for making an array of gain chips, and the method includes providing a common substrate, forming plural gain chips on the common substrate, each configured to generate a corresponding light beam, adding plural optical couplers on corresponding top surfaces of the plural gain chips, optically connecting plural optical fibers to corresponding one of the plurality of optical couplers, optically connecting an array wide optical coupler to the plural optical fibers, and optically connecting a single optical fiber to the array wide optical coupler to output the combined light beams.

BRIEF DESCRIPTION OF THE DRAWINGS

For a more complete understanding of the present invention, reference is now made to the following descriptions taken in conjunction with the accompanying drawings, in which:

FIG. 9 is a flow chart of a method for forming the array of gain chips of FIG. 7 or 8.

DETAILED DESCRIPTION OF THE INVENTION

The following description of the embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to an array of SLDs having a single DBR. However, the embodiments to be discussed next are not limited to such configuration, but may be applied to other SLDs that have two DBRs.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

According to an embodiment, there is an array of surface-emitting SLDs that can be integrated with available technologies in the fields of optical sensing and communication. These SLDs have a broad emission spectrum, high efficiency and directionality. Forming arrays of surface-emitting devices is easier and more practical than the edge-emitting counterparts. This allows for expanding the design into large arrays of SLDs, and thus, increasing the output optical power. The configurations discussed herein can be used as a broadband light source for optical coherence tomography (OCT), lighting, and optical communication. It is also possible to adopt it in interferometry sensors including fiber-optic gyroscopes. Furthermore, it can be used as a single-port gain chip for semiconductor optical amplifiers, tunable lasers, and multi-wavelength light sources.

Figure 1:
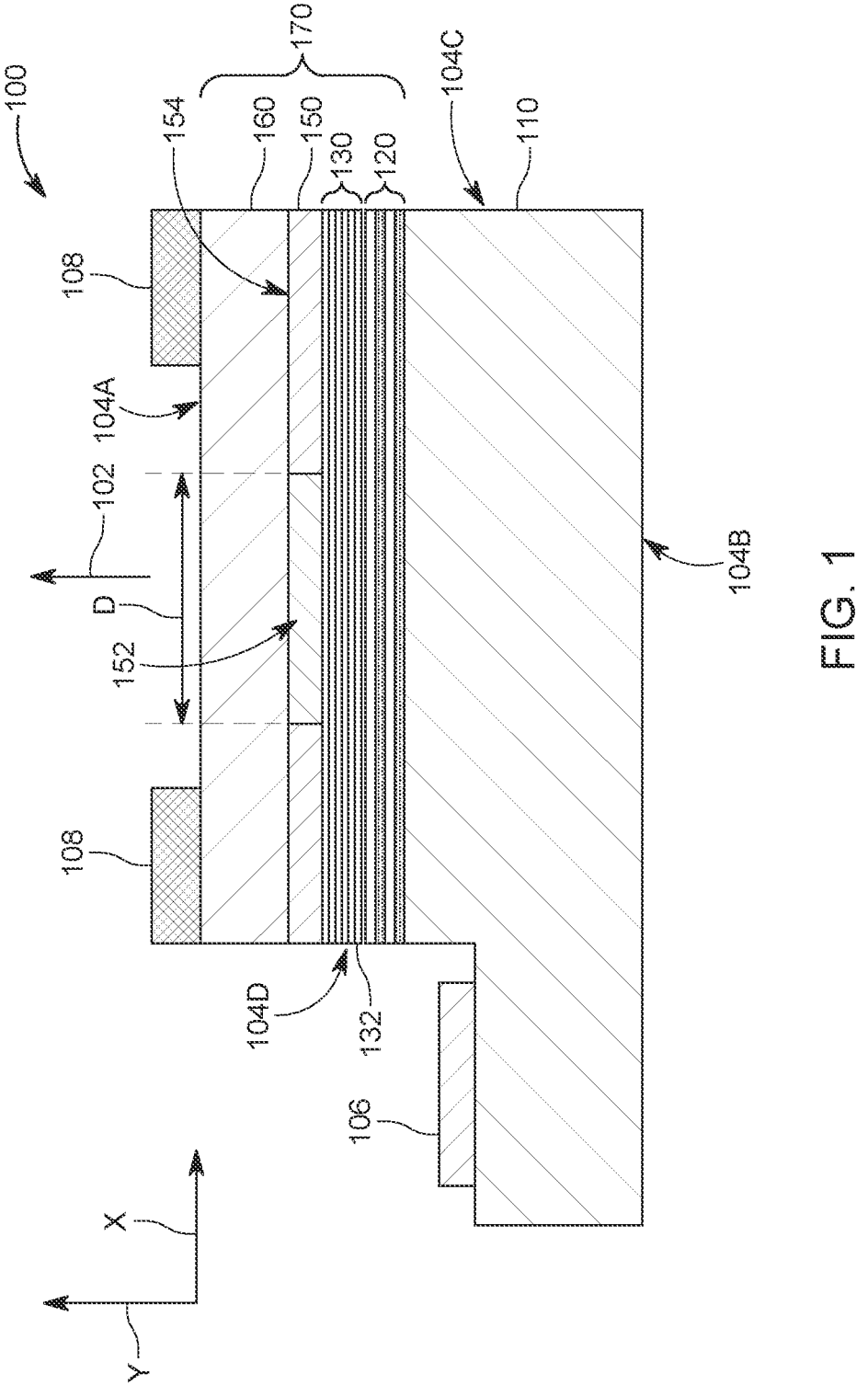
FIG. 1 is a schematic diagram of a surface-emitting gain chip with a single DBR.

The embodiment illustrated in FIG. 1 shows a gain chip (i.e., a semiconductor optical element used as an optical gain medium that can change the oscillation wavelength) 100 that is configured to emit a light beam 102 at a top surface 104A of the device, and not at the side surfaces 104C or 104D. A bottom surface 104B of the gain chip 100 is opposite to the top surface 104A. The bottom surface 104B corresponds to a substrate 110, which in this embodiment is an n-GaAs substrate. A high-reflectivity (>99.99%) bottom DBR 120 is formed over the substrate 110. In this embodiment, the DBR 120 is implemented as a plurality of n-AlGaAs/GaAs layers. An active region 130 is formed over the DBR 120 and includes, in this embodiment, at least one InGaAs quantum well (QW) layer 132 whose indium concentration is specified to achieve a targeted wavelength. More than one QW layers may be used for the active region 130.

An oxide aperture layer 150 is formed on the active region 130 as shown in the figure. In this embodiment, the oxide aperture layer 150 is made up of AlGaAs with a high Al concentration, for example, 98% or larger. A p-type semiconductor layer 160 is formed over the oxide aperture layer 150 to form a p-n junction with the substrate 110. In this embodiment, the p-type semiconductor layer 160 includes p-AlGaAs. The DBR layer 120, the active region 130, the oxide aperture layer 150, and the p-type layer 160 form a mesa 170, which in this embodiment is formed directly on the substrate 110 and has a side dimension smaller than the side dimension of the substrate.

Two metal contacts 106 and 108 are deposited on the gain chip 100. The first one 106 is placed directly on the n-type semiconductor substrate 110, on a region where there is no mesa, while the second one 108 is formed on top of the mesa 170, on the p-type semiconductor layer 160. The oxide aperture layer 150 forms an aperture 152 for allowing the photons generated in the active region 130 to exit the gain chip. The oxide aperture layer 150 is wet oxidized to control the diameter D of the aperture 152. Due to this process, the refraction index of the aperture 152 is larger than the refraction index of the rest 154 of the layer 150. Small diameters increase the current density and thus decreases the current threshold for VCSELs. A large aperture (diameter D from 10 to 100 μm) is preferred for this embodiment to increase the lateral size (on the X axis) of the pumped region, allowing for more transverse modes. A higher number of transverse modes lowers the spatial coherence of the gain chip 100, which makes it more suitable for lighting and imaging. Note that no lasing is taking place in the gain chip 100 because there is no top DBR. However, the light generated in the active region 130 is reflected a couple of times (not enough for lasing) due to Fresnel reflections.

Figure 2:
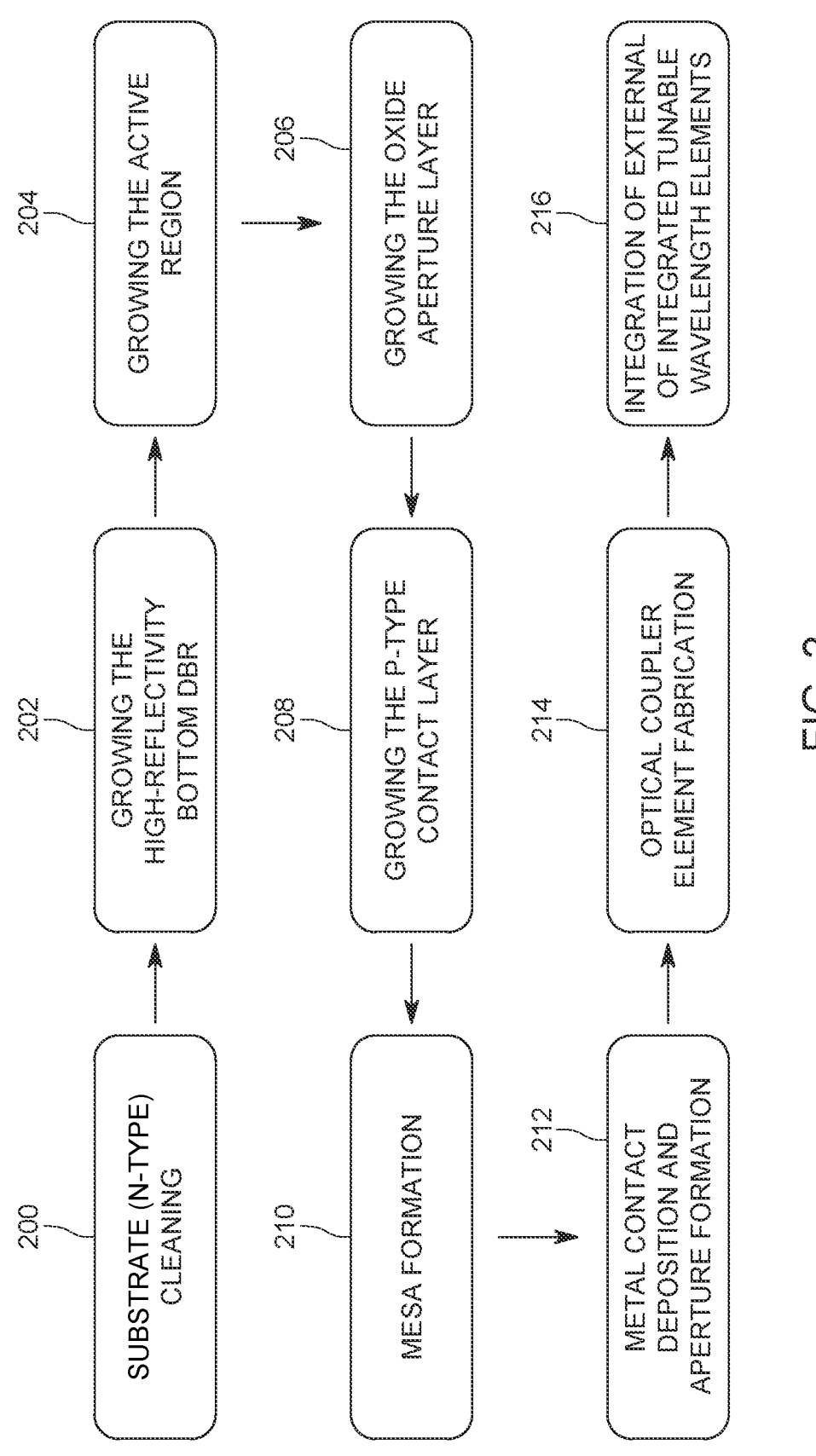
FIG. 2 is a flow chart of a method for making the gain chip with the single DBR.

FIG. 2 shows the flow chart of the growth and fabrication processes of the gain chip (or surface-emitting SLD) 100. The process starts in step 200 by providing the n-type semiconductor substrate 110 and cleaning it. Any known cleaning step may be used. In step 202, the DBR 120 is grown onto the substrate 100 by known methods. The DBR 120 may include many pairs of layers, each pair having a layer with a low index of refraction and a layer with a higher index of refraction. The active region 130 is grown in step 204 over the DBR 120 and then the oxide aperture layer 150 is grown in step 206 over the active region 130. The p-type semiconductor layer 160 is grown in step 208 over the oxide aperture layer 150 so that the mesa 170 is formed in step 210. Then, in step 212, the metal contacts 106 and 108 are formed by metal deposition and the aperture 152 is formed by wet oxidizing the oxide aperture layer 150. In step 214 an optical coupler (which is discussed later) is fabricated over the p-type semiconductor layer 160, in the space defined by the electrode 108. In this regard, note that the electrode 108 may have a circular opening formed to correspond to the aperture 152, to not impede the light beam 102. Finally, in step 216, various external tunable wavelength elements are formed over the optical coupler, as discussed later.

Figure 3:
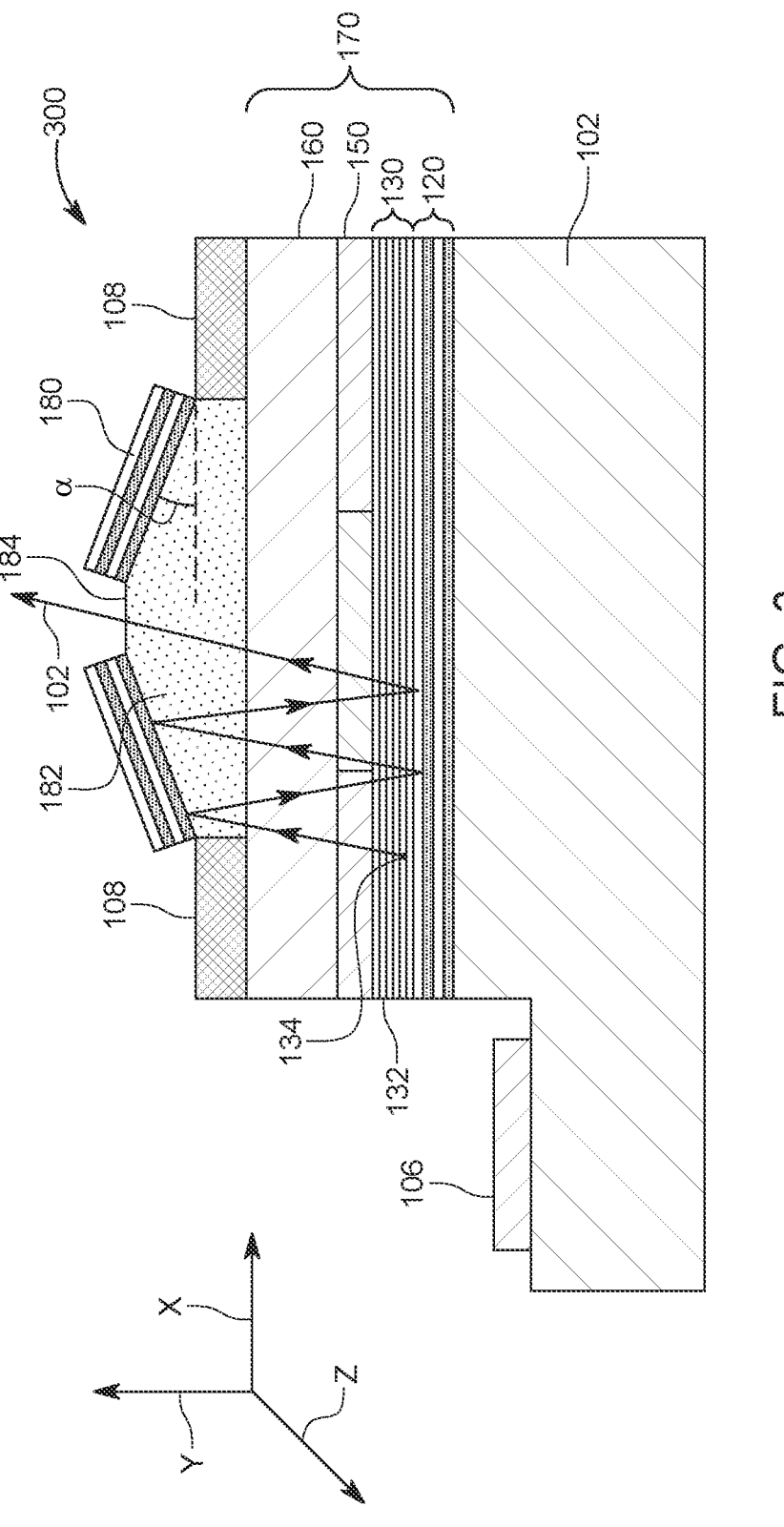
FIG. 3 is a schematic diagram of another surface-emitting gain chip with a horizontal DBR and a tilted top DBR.

In another embodiment, as illustrated in FIG. 3, a gain chip 300 has a top DBR 180 to improve the gain, without forming an optical cavity to suppress lasing. In other words, neither the gain chip 100 shown in FIG. 1, nor the gain chip 300 formed in FIG. 3 has an optical cavity, and thus no lasing is present in either device. Note that this is different from the LD, which has top and bottom DBRs arranged to achieve lasing. Avoiding the lasing for the gain chip 300 is possible because the top DBR 180 is titled relative to the planar surfaces of the other layers, which extend in the XZ plane in the figure. In this regard, note that FIG. 3 shows the top DBR 180 making a non-zero angle α with the XZ plane. To achieve this tilt of the top DBR 180, a tilted SiO$_2$ or polymer structure 182 is formed over the p-type semiconductor layer 160. This structure is shaped as a frustum (i.e., a pyramid or cone without the top portion) and the top DBR is formed on the sides of the frustum. The top surface 184 of the frustum 182 is flat, and that region constitutes the region where the light beam 102 is exiting the gain chip 300. Note that after a photon 134 is generated in one QW layer 132 of the active region 130, the photon bounces between the bottom DBR 120 and the top DBR 180 a couple of times until the photon/light beam 102 exits the gain chip 300. Although the photon 134 is reflected a couple of times between the top and bottom DBRs, due to the top DBR being tilted, the photon would not experience resonant feedback.

In another embodiment, the effective function of the tilted DBR 180 can be replaced by a flat high-contrast grating (HCG) or an inverse-design integrated structure (see, for example, Mediha Tutgun, Döne Yilmaz, Aydan Yeltik, Mirbek Turduev, Hamza Kurt, "Inverse design of all-dielectric parallel-plane mirror optical resonator," Photonics and Nanostructures—Fundamentals and Applications, 40, 100787 (2020) for details of these structures). The design of the tilted structure 180 can be carried out by simulation, including utilizing an inverse design algorithm to obtain the most optimum refractive index, shape and sizes, as constituent dielectric materials.

The proposed surface-emitting SLD devices 100/300 can be used in many applications given the ease of forming arrays. One of the main applications is in designing high-speed optical wireless communication transmitters. The large number of devices on the chip allows for the use of spatial-division multiplexing (SDM), especially using angle diversity, which allows for wide-area coverage by the transmitter. Pulse-amplitude modulation (PAM) can also take advantage of this configuration. Since increasing the number of transmitters can increase signal-to-noise ratio (SNR) by orders of magnitude, the transmitter can support a wide range of intensity levels, which is needed for PAM.

The devices 100/300 can also be used in applications where the unique characteristics of the SLDs are useful. For example, while lasers can be used in OCT, their long coherence length (high temporal coherence) lowers the resolution and introduces random noises and, therefore, are not ideal. SLDs, on the other hand, offer a shorter coherence length, which results in higher accuracy. They are also commonly used in fiber-optic gyroscopes (FOG). Moreover, the high spatial coherence of lasers causes speckles in their beam profile, which can distort the quality of the image of projectors using laser diodes. SLDs do not exhibit this high speckle density and can produce significantly higher brightness than LEDs. The SLD can also be used as a gain chip similar in function to the surface-emitting gain chip 100 in FIG. 1.

The gain chip 100/300 can also be used in semiconductor optical amplifiers (SOAs). Furthermore, by forming an external cavity, the lasing action can be achieved with a tunable wavelength, depending on the length of the external cavity or external tuning element, such as a micro-heater integrated waveguide or Fiber Bragg Gratings. By using this technique with multiple devices in an array, multiple-wavelength emission can be achieved. This can be used in wavelength-division multiplexing (WDM).

Figure 4:
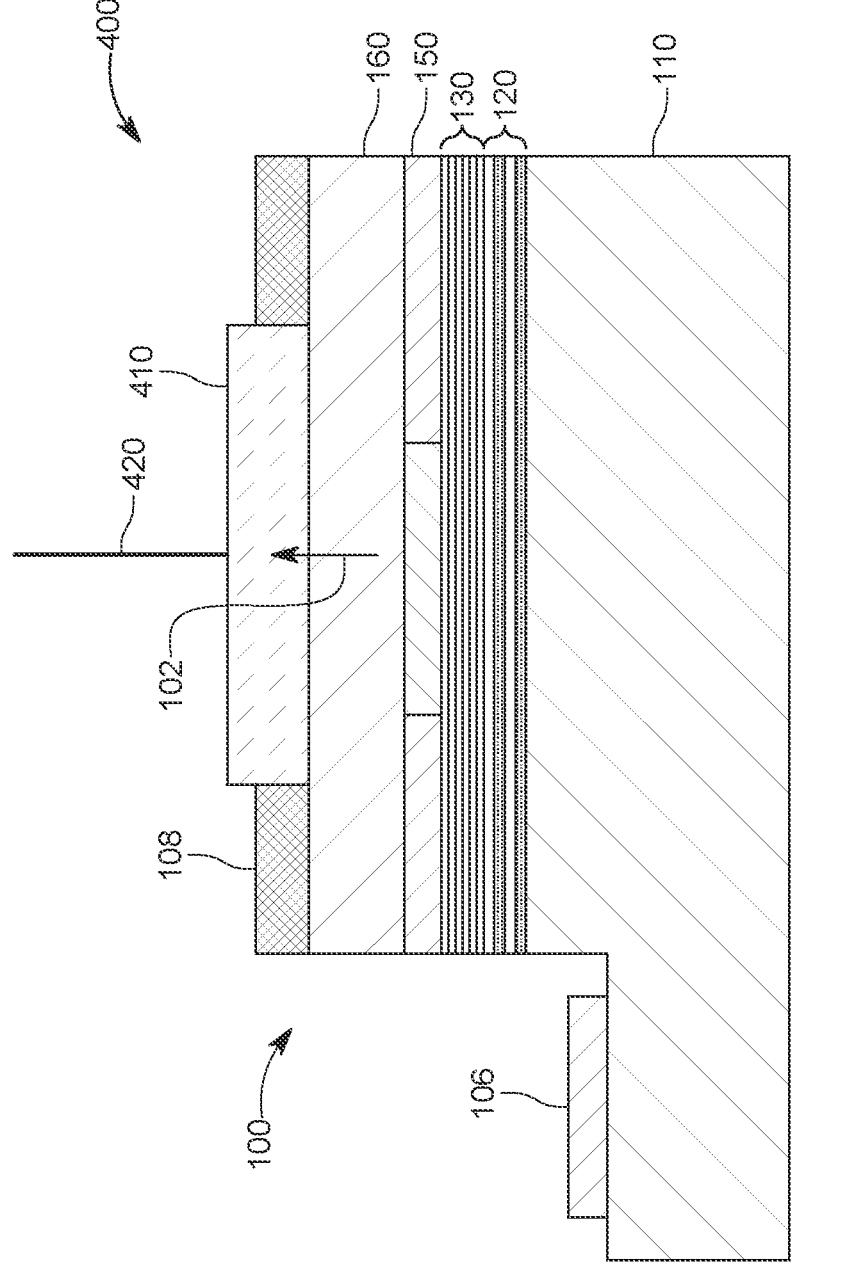
FIG. 4 is a schematic diagram of the gain chip with an optical coupler provided on a top surface for capturing the emitted light beam.

The surface-emitting gain chip 100/300 can also be integrated with optical waveguides such as optical fibers, as shown in FIG. 4, to form an optical device 400. An optical coupler 410 is used to couple the output light 102 from the gain chip 100 or 300 into a single-mode (SMF) or a multi-mode fiber (MMF) 420. The optical coupler 410 is designed such that its refractive index matches that of the p-type contact layer 160. This allows for the use of the gain chip 100/300 in telecommunication systems and in interferometry.

Figure 5A:
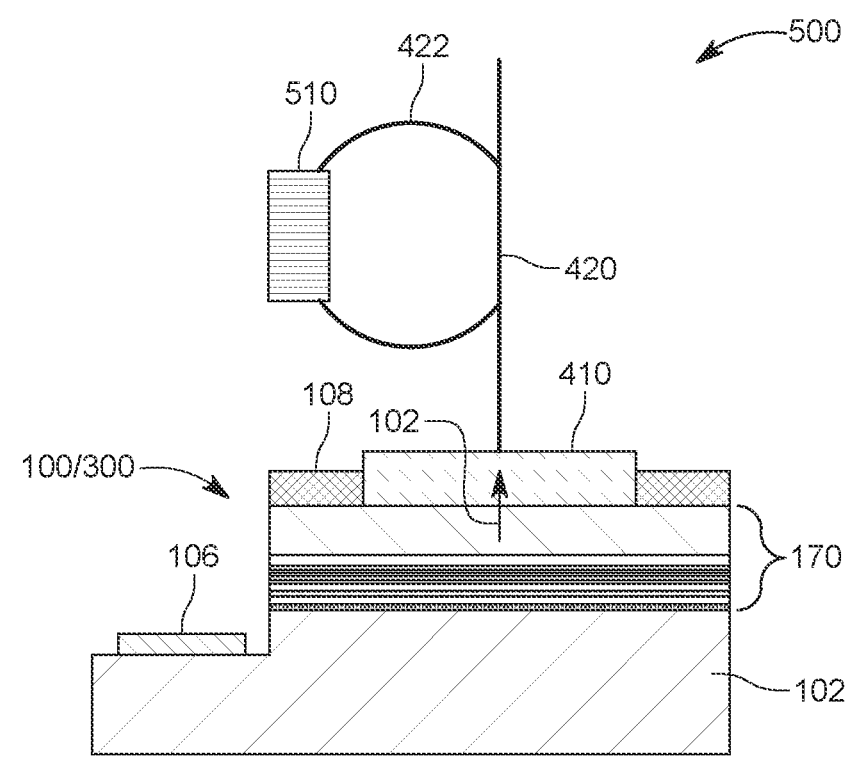
FIG. 5A is a schematic diagram of the gain chip with a fiber Bragg grating and FIG. 5B is a schematic diagram of the gain chip with the fiber Bragg grating and a wavelength tuning element.
Figure 5B:
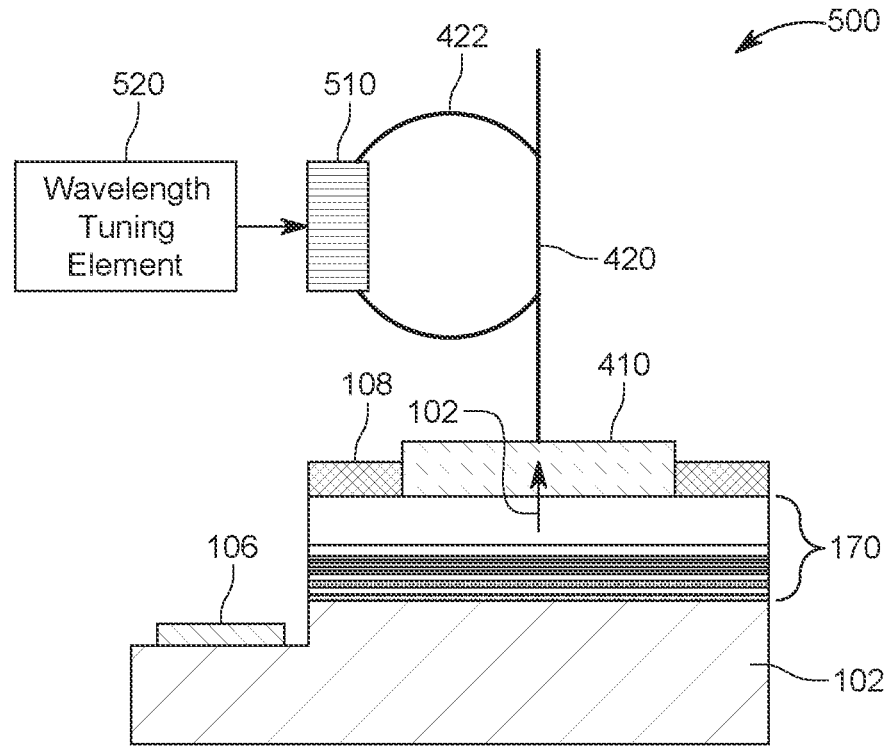

The fiber 420 on each gain chip 100/300 can include a fiber Bragg grating (FBG) 510, as shown in FIG. 5A. Note that the looped fiber 422 may be part of the fiber 420 or may be optically connected to the fiber 420. The optical system 500 in this figure uses the FBG 510 to achieve narrow linewidth lasing from the gain chip 100/300. By including a thermoelectric cooler (TEC) 520, as shown in FIG. 5B, the wavelength of the beam light 102 generated by the gain chip 100/300 can be precisely tuned. In other words, the TEC 520 is used to cool or heat the FBG 510, which changes the structure of the FBG, which inherently changes the wavelength of the light beam 102. Instead of using discrete elements as shown in FIGS. 5A and 5B, the optical system 500 can be integrated with on-chip elements, as shown in the block diagram in FIG. 6, to achieve either one of the two functionalities of the emitting superluminescent or the tunable laser light by turning a feedback element off or on, respectively.

Figure 6:
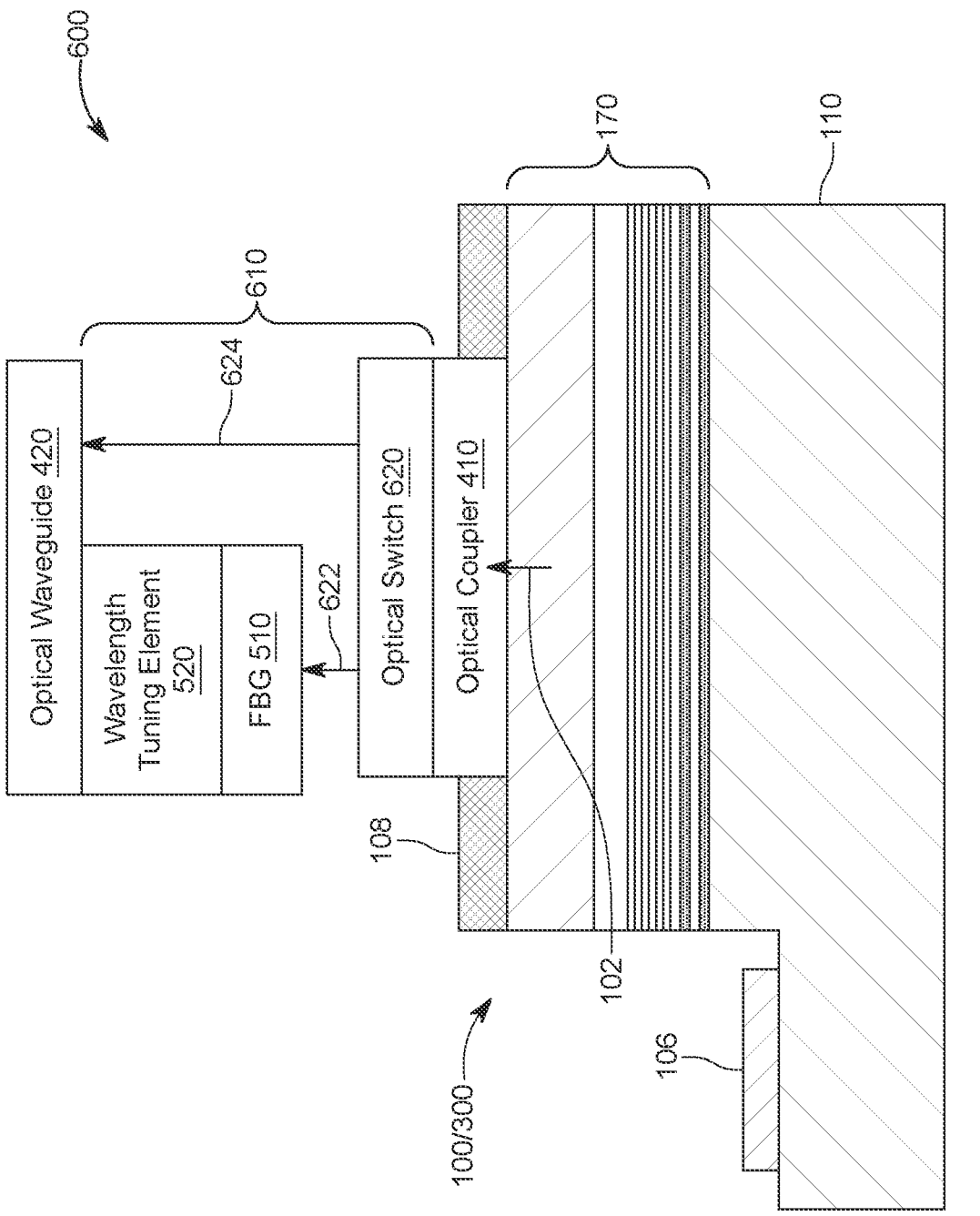
FIG. 6 is a schematic diagram of the gain chip with a feedback control mechanism.

More specifically, FIG. 6 shows that the optical coupler 410 is connected to an optical switch 620. The optical switch 620 is configured to send the generated light beam 102 along one of two paths 622 and 624, where the first path 622 corresponds to a feedback on state and path 624 corresponds to a feedback off state. If the optical switch 620 directs the light beam 102 along the path 622, then the light beam next enters the FBG 510 shown in FIGS. 5A and 5B. The FBG 510 is tuned by the wavelength tunning element 520 shown in FIG. 5B. After adjusting as desired the wavelength of the light beam 102 with the wavelength tuning element 520, the adjusted light beam is injected into the optical waveguide 420. However, if the optical beam 102 is sent along the path 624, it enters directly the optical waveguide 420. Thus, the path 622 corresponds to the configuration shown in FIG. 5B while the path 624 corresponds to the configuration shown in FIG. 4. The desired configuration is selected with the optical switch 620. Thus, the optical switch 620, paths 622 and 624 (which may include optical fibers), FBG 510, and wavelength tunning element 520 form a feedback control mechanism 610.

Figure 7:
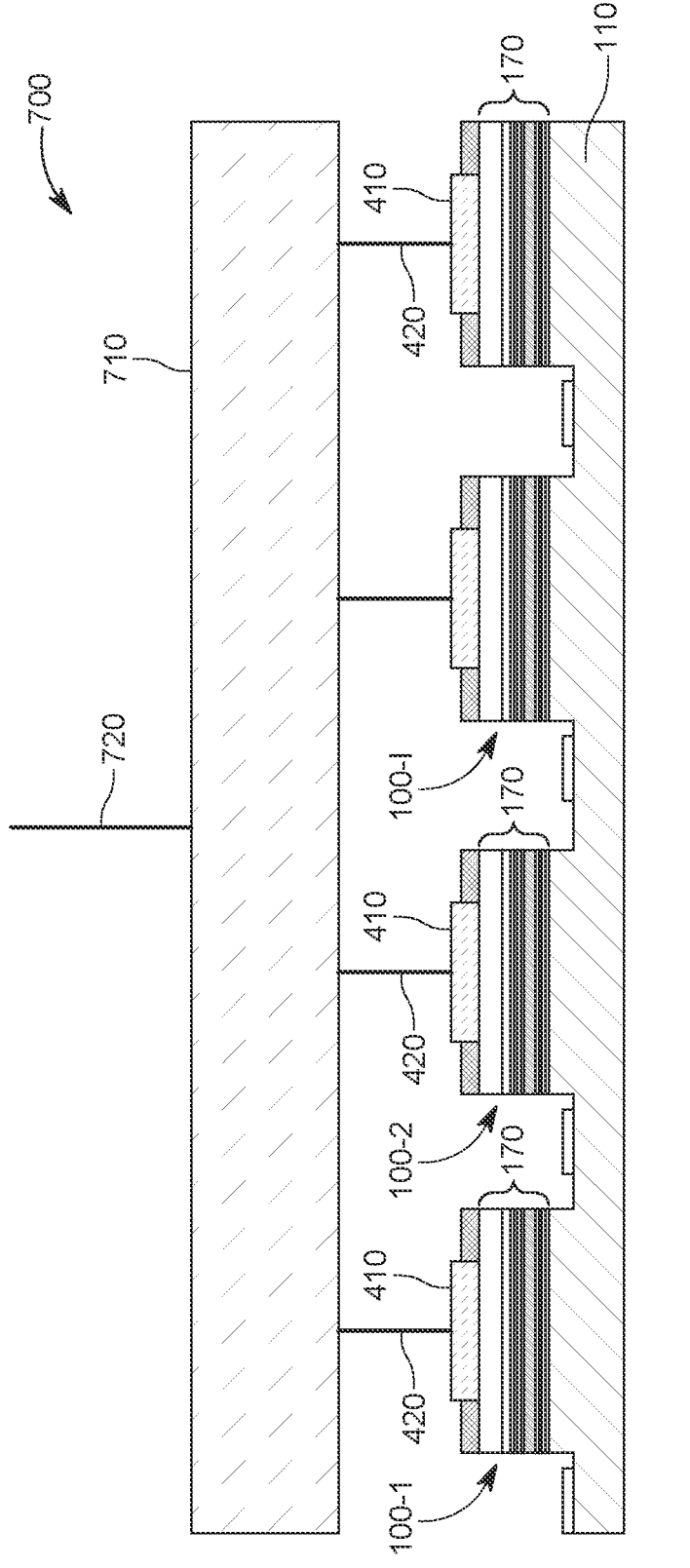
FIG. 7 is a schematic diagram of an array of gain chips formed on a common substrate and having a system wide optical coupler.

Any of the various configurations discussed above may be used on a same wafer by coupling the light beams from multiple devices, as shown in FIG. 7, so that each device emits at a specific wavelength and thus WDM is easily implemented. More specifically, FIG. 7 shows an optical system 700 (array of gain chips) in which plural gain chips 100-I (or gain chips 300) with a corresponding optical coupler 410 and a corresponding optical fiber 420 are manufactured on the same n-type substrate 110. The corresponding optical beams 102 are injected in the corresponding optical fibers 420 and all the optical fibers 420 are connected to a system wide optical coupler 710. Thus, the combined optical beams 102 are then injected into a single optical fiber 720. Such an array of devices can integrate an optical phased array for beam steering, which is critical for light detection and ranging (LiDAR) applications. While the optical system 700 is shown having plural gain chips 100-I, one skilled in the art would understand that the gain chips 100 can be replaced with the gain chips 300 or other gain chips discussed herein.

Figure 8:
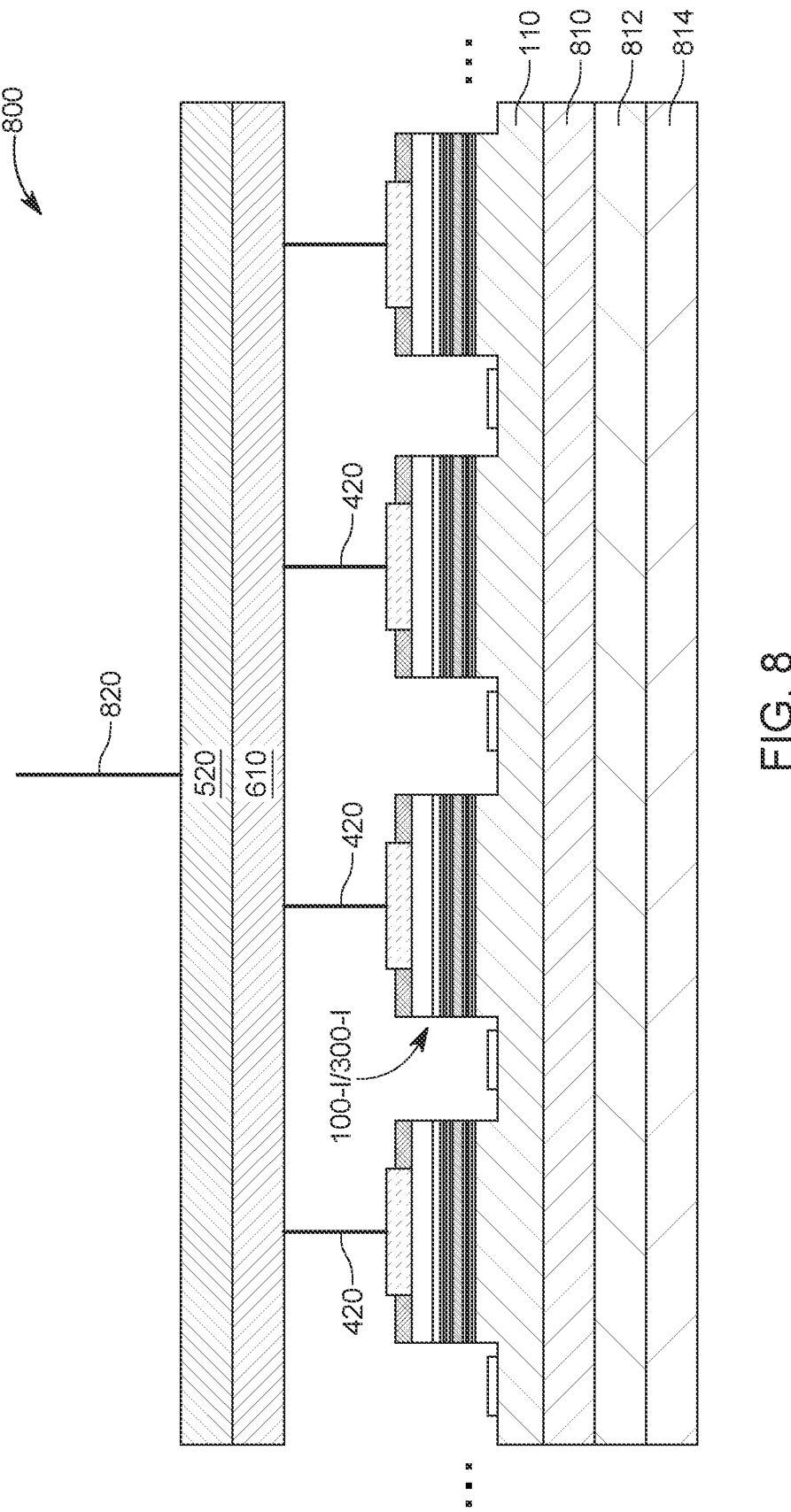
FIG. 8 is a schematic diagram of an array of gain chips formed on a common substrate and having a feedback control mechanism.

FIG. 8 shows the block diagram of another optical system 800 that is fully integrated on a single substrate and includes plural gain chips 100 or 300, each gain chip being capable of generating a corresponding optical beam having a given wavelength. More specifically, FIG. 8 shows plural gain chips 100 or 300 integrated on the same substrate 110. On the bottom of the substrate 110, various other elements are formed, for example, controlling circuitry 810 for individually addressing each gain chip, a heat sink 812 for removing the heat from the gain chips, and a power source 814 for powering the gain chips. The power source may be a battery or solar cells or both, in which case the battery can store energy harvested by the solar cells, to be used to power up the gain chips when no light sources are available. The individually addressable devices form a two-dimensional array.

On the other side of the optical system 800, a feedback control mechanism 610, similar to that shown in FIG. 6, may be used with each gain chip for controlling which paths the generated light beam is taken. In one application, each gain chip 100/300 has its own feedback control mechanism 610. An individual wavelength tuning mechanism 520 may be part of the feedback control mechanism 610 or may separately added, to tune the generated wavelength of each light beam. The adjusted and combined light beams are then injected into an optical fiber 820. The integrated feedback control mechanism 610 can be individually addressed to achieve lasing or superluminescence for each gain chip. The wavelength of each of them can also be controlled.

A method for making an array 700 or 800 of surface-emitting superluminescent diodes is now discussed with regard to FIG. 9. The method includes a step 900 of providing a common substrate, a step 902 of forming plural gain chips 100, 300, or 500 on the common substrate, each configured to generate a corresponding light beam, a step 904 of adding plural optical couplers on corresponding top surfaces of the plural gain chips, a step 906 of optically connecting plural optical fibers to corresponding one of the plurality of optical couplers, a step 908 of optically connecting an array wide optical coupler to the plural optical fibers, and a step 910 of optically connecting a single optical fiber to the array wide optical coupler to output the combined light beams.

The disclosed embodiments provide a tunable wavelength surface-emitting SLD array that it used for sensing and/or communication. It should be understood that this description is not intended to limit the invention. On the contrary, the embodiments are intended to cover alternatives, modifications and equivalents, which are included in the spirit and scope of the invention as defined by the appended claims. Further, in the detailed description of the embodiments, numerous specific details are set forth in order to provide a comprehensive understanding of the claimed invention. However, one skilled in the art would understand that various embodiments may be practiced without such specific details.

Although the features and elements of the present embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. An array of surface-emitting gain chips comprising:
   a common substrate;
   plural gain chips formed on the common substrate, each configured to generate a light beam;
   plural optical couplers, each located on a top surface of a corresponding p-type contact layer of a corresponding gain chip of the plural gain chips, wherein an index of refraction of an optical coupler of the plural optical couplers matches an index of refraction of the corresponding p-type contact layer of the corresponding gain chip;
   plural optical fibers, each connected with one end to a corresponding optical coupler of the plurality of optical couplers;

an array wide optical coupler connected to another end of the plural optical fibers; and a single optical fiber connected to the array wide optical coupler and configured to output the combined light beams.

2. The array of claim 1, wherein each gain chip includes a distributed Bragg reflector, DBR, formed on the common substrate.

3. The array of claim 2, wherein each gain chip further includes an active region formed on the DBR, the active region including at least one quantum well layer.

4. The array of claim 3, wherein each gain chip further includes an oxide aperture layer formed on the active region, the oxide aperture layer having an aperture with a first refraction index and the remaining of the layer has a second refraction index, different from the first refraction index.

5. The array of claim 4, wherein each gain chip further includes a p-type semiconductor layer formed over the oxide aperture layer, a first contact formed on the common substrate and a second contact formed on the p-type semiconductor layer.

6. The array of claim 5, wherein the common substrate is a n-type semiconductor and together with the p-type semiconductor layer form a pn junction.

7. The array of claim 5, wherein each gain chip further includes a frustum shaped structure formed on the p-type semiconductor layer, and another DBR formed on the frustum shaped structure so that there is an opening at a top of the frustum shape structure to allow a corresponding light beam to exit.

8. The array of claim 1, further comprising:

a fiber Bragg grating, FBG, connected to each optical fiber of the plural optical fibers; and a wavelength tunning element located next to each FBG and configured to adjust a wavelength of the generated light beam by changing a temperature of the FBG, to independently tune the wavelength of each generated light beam.

9. The array of claim 1, wherein there is no other DBR structure formed in any of the plural gain chips so that there is no lasing.

10. An array of surface-emitting gain chips comprising:

a common substrate;

plural gain chips formed on the common substrate, each configured to generate a light beam;

plural optical couplers, each located on a top surface of a corresponding gain chip of the plural gain chips;

plural optical fibers, each connected with one end to a corresponding optical coupler of the plurality of optical couplers;

a feedback control mechanism connected to the plural optical fibers and configured to switch between a first optical path that has a wavelength tunning element and a second optical path that does not have a wavelength tunning element; and a single optical fiber connected to the feedback control mechanism and configured to output the combined light beams.

11. The array of claim 10, further comprising:

controlling circuitry formed on the common substrate, opposite to the plural gain chips, to independently control each gain chip;

a heatsink to dissipate thermal energy generated by the plural gain chips; and a power source configured to provide power to the plural gain chips.

12. The array of claim 10, wherein each gain chip includes a distributed Bragg reflector, DBR, formed on the common substrate.

13. The array of claim 12, wherein each gain chip further includes an active region formed on the DBR, the active region including at least one quantum well layer.

14. The array of claim 13, wherein each gain chip further includes an oxide aperture layer formed on the active region, the oxide aperture layer having an aperture with a first refraction index and the remaining of the layer has a second refraction index, different from the first refraction index.

15. The array of claim 14, wherein each gain chip further includes a p-type semiconductor layer formed over the oxide aperture layer, a first contact formed on the common substrate and a second contact formed on the p-type semiconductor layer.

16. The array of claim 15, wherein the common substrate is a n-type semiconductor and together with the p-type semiconductor layer form a pn junction.

17. The array of claim 15, wherein each gain chip further includes a frustum shaped structure formed on the p-type semiconductor layer, and another DBR formed on the frustum shaped structure so that there is an opening at a top of the frustum shape structure to allow a corresponding light beam to exit.

18. The array of claim 10, further comprising:

a fiber Bragg grating, FBG, connected to each optical fiber of the plural optical fibers; and a wavelength tunning element located next to each FBG and configured to adjust a wavelength of the generated light beam by changing a temperature of the FBG, to independently tune the wavelength of each generated light beam.

19. The array of claim 10, wherein there is no other DBR structure formed in any of the plural gain chips so that there is no lasing.

20. A method for making an array of gain chips, the method comprising:

providing a common substrate;

forming plural gain chips on the common substrate, each configured to generate a corresponding light beam;

adding plural optical couplers on corresponding top surfaces of p-type contact layers of the plural gain chips, wherein an index of refraction of an optical coupler of the plural optical couplers matches an index of refraction of the p-type contact layers of the plural gain chip;

optically connecting plural optical fibers to corresponding one of the plurality of optical couplers;

optically connecting an array wide optical coupler to the plural optical fibers; and optically connecting a single optical fiber to the array wide optical coupler to output the combined light beams.

* * * * *